US012538490B2

United States Patent
Kang et al.

(10) Patent No.: US 12,538,490 B2
(45) Date of Patent: Jan. 27, 2026

(54) CONFINED CHARGE TRAP LAYER

(71) Applicant: Applied Materials, Inc., Santa Clara, CA (US)

(72) Inventors: Chang Seok Kang, Santa Clara, CA (US); Tomohiko Kitajima, San Jose, CA (US); Mihaela A. Balseanu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/425,633

(22) Filed: Jan. 29, 2024

(65) Prior Publication Data

US 2024/0206172 A1    Jun. 20, 2024

Related U.S. Application Data

(62) Division of application No. 17/346,910, filed on Jun. 14, 2021, now Pat. No. 11,930,637.

(Continued)

(51) Int. Cl.
| | |
|---|---|
| *H10B 43/27* | (2023.01) |
| *H01L 21/67* | (2006.01) |
| *H01L 21/687* | (2006.01) |
| *H10D 30/69* | (2025.01) |
| *H10D 64/01* | (2025.01) |

(52) U.S. Cl.
CPC ....... *H10B 43/27* (2023.02); *H01L 21/67167* (2013.01); *H01L 21/68707* (2013.01); *H10D 30/694* (2025.01); *H10D 64/037* (2025.01)

(58) Field of Classification Search
CPC .............. H10B 43/27; H01L 29/40117; H01L 21/67167; H01L 21/68707; H01L 29/4234
See application file for complete search history.

(56) References Cited

U.S. PATENT DOCUMENTS 9,484,353 B1 * 11/2016 Lai ..................... H01L 29/40114
9,911,591 B2    3/2018 Thompson et al.
(Continued)

FOREIGN PATENT DOCUMENTS

| | | | |
|---|---|---|---|
| JP | 2020047744 A | 3/2020 | |
| JP | 2020518135 A | 6/2020 | |

(Continued)

OTHER PUBLICATIONS

"PCT International Search Report and Written Opinion in PCT/US2021/037302 dated Oct. 6, 2021, 12 pages".

(Continued)

*Primary Examiner* — Mohammad M Choudhry
(74) *Attorney, Agent, or Firm* — SERVILLA WHITNEY LLC

(57) ABSTRACT

Described is selective deposition of a silicon nitride (SiN) trap layer to form a memory device. A sacrificial layer is used for selective deposition in order to permit selective trap deposition. The trap layer is formed by deposition of a mold including a sacrificial layer, memory hole (MH) patterning, sacrificial layer recess from MH side, forming a deposition-enabling layer (DEL) on a side of the recess, and selective deposition of trap layer. After removing the sacrificial layer from a slit pattern opening, the deposition-enabling layer (DEL) is converted into an oxide to be used as blocking oxide.

7 Claims, 17 Drawing Sheets

Related U.S. Application Data

(60) Provisional application No. 63/041,268, filed on Jun. 19, 2020.

(56) References Cited

U.S. PATENT DOCUMENTS

| | | | |
|---|---|---|---|
| 9,960,045 | B1 | 5/2018 | Purayath |
| 10,319,583 | B2 | 6/2019 | Li et al. |
| 10,319,739 | B2 | 6/2019 | Purayath |
| 10,325,923 | B2 | 6/2019 | Purayath |
| 10,354,916 | B2 | 7/2019 | Chen et al. |
| 10,410,869 | B2 | 9/2019 | Roy et al. |
| 10,468,259 | B2 | 11/2019 | Purayath et al. |
| 10,529,737 | B2 | 1/2020 | Purayath |
| 10,541,246 | B2 | 1/2020 | Purayath |
| 10,553,604 | B2 | 2/2020 | Lu et al. |
| 10,622,251 | B2 | 4/2020 | Chen et al. |
| 10,790,298 | B2 | 9/2020 | Purayath |
| 10,886,172 | B2 | 1/2021 | Chen |
| 10,964,717 | B2 | 3/2021 | Kang et al. |
| 10,998,329 | B2 | 5/2021 | Koshizawa et al. |
| 11,024,371 | B2 | 6/2021 | Cui et al. |
| 11,049,695 | B2 | 6/2021 | Kang et al. |
| 2007/0042548 | A1 | 2/2007 | Noh et al. |
| 2014/0175530 | A1 | 6/2014 | Chien et al. |
| 2015/0123189 | A1 | 5/2015 | Sun et al. |
| 2015/0380432 | A1 | 12/2015 | Ramaswamy |
| 2017/0047340 | A1 | 2/2017 | Huo |
| 2017/0069637 | A1 | 3/2017 | Son et al. |
| 2017/0278864 | A1 | 9/2017 | Hu et al. |
| 2017/0317099 | A1* | 11/2017 | Huang .......... H10B 43/27 |
| 2017/0330887 | A1* | 11/2017 | Kim .......... H10B 43/27 |
| 2017/0352531 | A1 | 12/2017 | Dube et al. |
| 2018/0090307 | A1 | 3/2018 | Brunner et al. |
| 2018/0144977 | A1 | 5/2018 | Yu et al. |
| 2018/0166461 | A1* | 6/2018 | Shim .......... H01L 23/5226 |
| 2018/0330985 | A1 | 11/2018 | Yu et al. |
| 2018/0374866 | A1 | 12/2018 | Makala et al. |
| 2019/0146679 | A1* | 5/2019 | Doh .......... G06F 3/0659 |
| | | | 711/103 |
| 2019/0393042 | A1 | 12/2019 | Roy et al. |
| 2020/0051994 | A1 | 2/2020 | Purayath et al. |
| 2020/0118822 | A1 | 4/2020 | Falk et al. |
| 2020/0144331 | A1 | 5/2020 | Simsek-Ege et al. |
| 2020/0185408 | A1 | 6/2020 | Song et al. |
| 2020/0203373 | A1 | 6/2020 | Kang et al. |
| 2020/0266211 | A1 | 8/2020 | Tao et al. |
| 2020/0312874 | A1 | 10/2020 | Kang et al. |
| 2020/0350014 | A1 | 11/2020 | Liu |
| 2020/0350287 | A1 | 11/2020 | Liu |
| 2020/0402562 | A1 | 12/2020 | Li et al. |
| 2020/0411509 | A1 | 12/2020 | Yang et al. |
| 2021/0043643 | A1 | 2/2021 | Lu et al. |
| 2021/0126005 | A1 | 4/2021 | Lu et al. |
| 2021/0210142 | A1 | 7/2021 | Liu |
| 2021/0217773 | A1 | 7/2021 | Kang et al. |
| 2021/0225865 | A1 | 7/2021 | Wu |
| 2021/0233779 | A1 | 7/2021 | Kang et al. |
| 2021/0233918 | A1 | 7/2021 | Koshizawa et al. |
| 2021/0249436 | A1 | 8/2021 | Ding et al. |
| 2021/0257375 | A1 | 8/2021 | Koshizawa et al. |
| 2021/0257385 | A1 | 8/2021 | Hu et al. |
| 2021/0257386 | A1 | 8/2021 | Wang et al. |
| 2021/0257387 | A1 | 8/2021 | Huang et al. |

FOREIGN PATENT DOCUMENTS

| | | |
|---|---|---|
| KR | 20140087023 A | 7/2014 |
| TW | 201431049 A | 8/2014 |
| WO | 2018195423 A1 | 10/2018 |
| WO | 2018200133 A1 | 11/2018 |

OTHER PUBLICATIONS

Fu, Chung-Hao, et al., "A Novel Confined Nitride-Trapping Layer Device for 3D NAND Flash with Robust Retention Performances", 2019 Symposium on VLSI Technology Digest of Technical Papers.

Yokoyama, Shin, et al., "Atomic-layer selective deposition of silicon nitride on hydrogenterminated Si surfaces (Abstract)", Applied Surface Science, vols. 130-132, Jun. 1998, pp. 352-356.

* cited by examiner

CONFINED CHARGE TRAP LAYER

CROSS-REFERENCE TO RELATED APPLICATIONS

This application is a divisional of U.S. patent application Ser. No. 17/346,910, filed Jun. 14, 2021, which claims priority to U.S. Provisional Application Ser. No. 63/041,268, filed Jun. 19, 2020, the entire disclosures of which are hereby incorporated by reference herein.

TECHNICAL FIELD

Embodiments of the present disclosure pertain to the field of electronic devices and methods and apparatus for manufacturing electronic devices. More particularly, embodiments of the disclosure provide methods for forming 3D-NAND mold stacks.

BACKGROUND

Semiconductor technology has advanced at a rapid pace and device dimensions have shrunk with advancing technology to provide faster processing and storage per unit space. In NAND devices, the string current needs to be high enough to obtain sufficient current to differentiate ON and OFF cells. The string current is dependent on the carrier mobility which is enhanced by enlarging the grain size of the silicon channel.

Existing 3D-NAND memory stacks with alternating layers of oxide and nitride have confined silicon nitride (SiN) charge trap layers that are formed by deposition of a continuous trap layer. Existing 3D-NAND memory stacks have cell performance degradation in charge trap-based memory due to charge spreading and cell-to-cell interference aggravated by reduction of cell-to-cell distance.

Accordingly, there is a need in the art for 3D-NAND devices having a confined charge trap layer which will suppress performance degradation in charge trap-based memory. Additionally, there is a need in the art for methods and apparatus for forming the 3D-NAND devices.

SUMMARY

One or more embodiments of the disclosure are directed to method of forming memory devices. In one embodiment, a method of forming an electronic device comprises: forming an opening in a memory stack comprising alternating layers of a first material layer and a second material layer, the memory stack on a common source line; recessing the second material layer through the opening to form a first recessed region; forming a deposition enabling layer (DEL) on a surface of the first recessed region; recessing the deposition enabling layer (DEL) to form a second recessed region; and selectively depositing a trap layer in the second recessed region.

Additional embodiments of the disclosure are directed to memory devices. In one an embodiment, a nonvolatile memory device comprises: a memory stack comprising a memory cell and a memory hole, the memory cell comprising a gate, a channel layer, and a trap layer confined between the gate and the channel layer, and the memory hole extending through the memory stack and having a first portion and a second portion, the second portion comprising a common source layer, wherein the trap layer is on a sidewall of the common source layer.

Further embodiments of the disclosure are directed to processing tools. In one embodiment, a processing tool comprises: a central transfer station comprising a robot configured to move a wafer; a plurality of process stations, each process station connected to the central transfer station and providing a processing region separated from processing regions of adjacent process stations, the plurality of process stations comprising a trap layer selective deposition chamber; and a controller connected to the central transfer station and the plurality of process stations, the controller configured to activate the robot to move the wafer between process stations, and to control a process occurring in each of the process stations.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
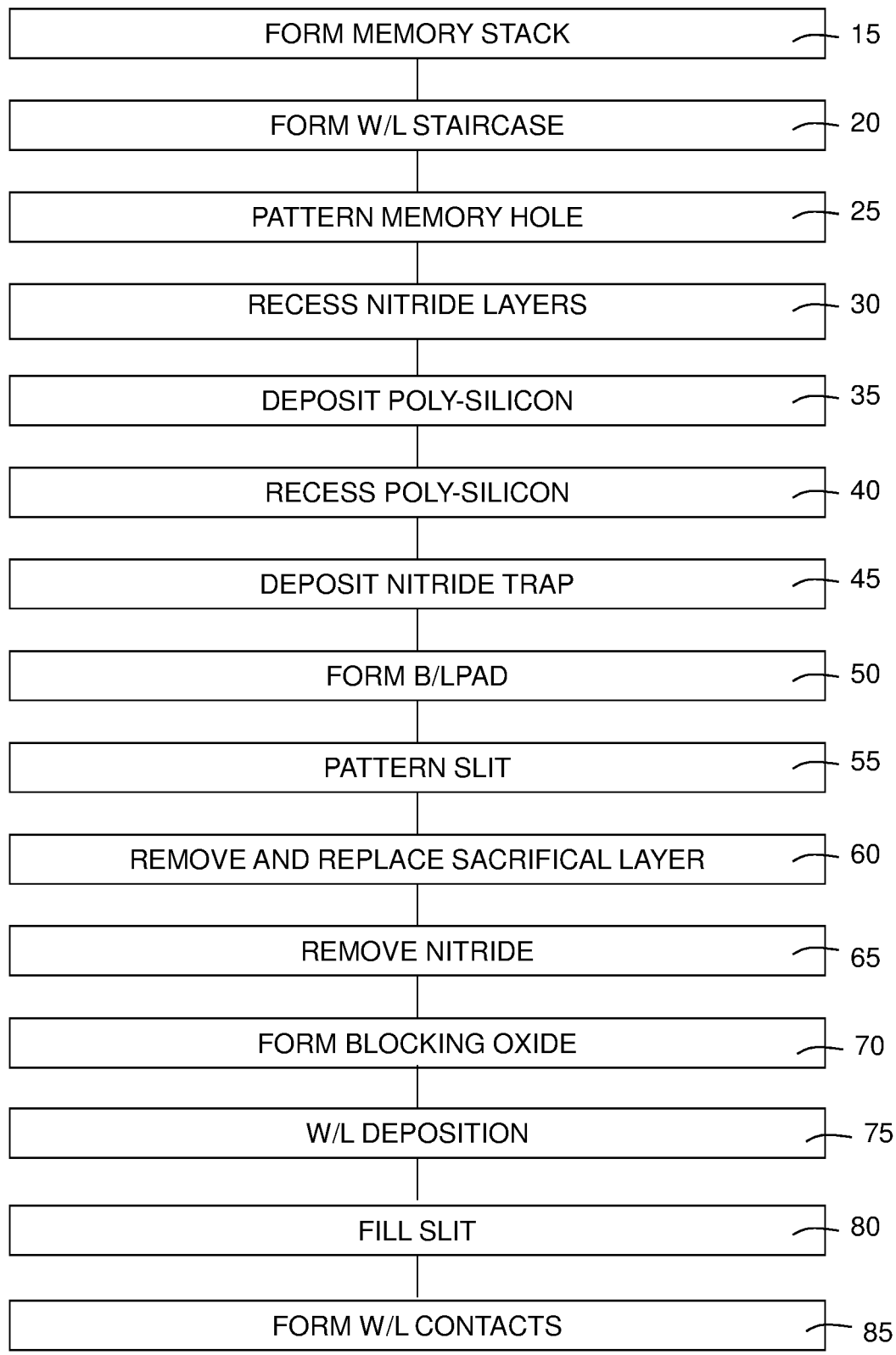
FIG. 1 illustrates a process flow diagram of a method of forming a memory device according to embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor", "reactant", "reactive gas" and the like are used interchangeably to refer to any gaseous species that can react with the substrate surface.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been descried in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

In existing 3D NAND stacks based on a charge trap as a storage layer, the charge trap is continuous layer. The continuous charge trap layer causes two significant issues which hinders a scale-down of word line (WL) to WL insulators—cell to cell interference and lateral charge spreading. In one or more embodiments, to suppress the cell-to-cell interference and lateral charge spreading, the trap layer under the source and drain (S/D) of each cell is eliminated (i.e., a trap-cut or confined structure). Existing trap-cut structures are problematic in that there is partial use of gate area and variation of shape and thickness in trap silicon nitride (SiN) due to deposition and removal process. Accordingly, one or more embodiments provide a novel structure and method to place a trap layer efficiently for a given word line thickness and allow suppressed variation of trap layer shape and thickness.

One or more embodiments provide selective deposition of a silicon nitride (SiN) trap layer. In one or more embodiments, a sacrificial layer is used for selective deposition (also referred to as a deposition-enabling layer (DEL)) in order to permit selective trap SiN deposition. In one or more embodiments, the trap layer is formed by deposition of a mold including a sacrificial layer, memory hole (MH) patterning, sacrificial layer recess from MH side, forming a deposition-enabling layer (DEL) on a side of the recess, and selective deposition of trap layer. In one or more embodiments, the blocking oxide is formed—after removing the sacrificial layer from a slit side, the deposition-enabling layer (DEL) is converted into oxide to be used as blocking oxide. In one or more embodiments, a high-k dielectric layer, barrier layer, and word line (WL) are then formed.

In one or more embodiments, a trap layer is advantageously confined only between the tunnel oxide and the word line. Cell to cell interference and lateral spreading are advantageously suppressed. In one or more embodiments, selective deposition of trap layer advantageously suppresses variations in shape and thickness of trap layer.

In one or more embodiments, metal deposition and other processes can be carried out in an isolated environment (e.g., a cluster process tool). Accordingly, some embodiments of the disclosure provide integrated tool systems with related process modules to implement the methods.

FIG. 1 illustrates a flowchart for an exemplary method 10 for forming a memory device. The skilled artisan will recognize that the method 10 can include any or all of the processes illustrated. Additionally, the order of the individual processes can be varied for some portions. The method 10 can start at any of the enumerated processes without deviating from the disclosure. With reference to FIG. 1, at operation 15, a memory stack is formed. At operation 20, a word line staircase is formed in the memory stack. At operation 25, a memory hole channel is patterned into the word line staircase. At operation 30, optionally, the first layers, e.g., nitride layers, may be recessed through the memory hole channel. At operation 35, a polysilicon layer is deposited. At operation 40, the polysilicon layer is recessed. At operation 45, the trap layer is deposited. At operation 50, the bit line pad is formed. At operation 55, the memory staircase is slit patterned. At operation 60, the sacrificial layer is removed and replaced. At operation 65, the first layers, e.g., nitride layers, are removed. At operation 70, the polysilicon layer is oxidized to form a blocking oxide. At operation 75, the word line material is deposited. At operation 80, the slit is filled, and, at operation 85, the word line contacts are formed.

FIGS. 2-21 illustrate a portion of a memory device 100 following the process flow illustrated for the method 10 in FIG. 1.

Figure 2:
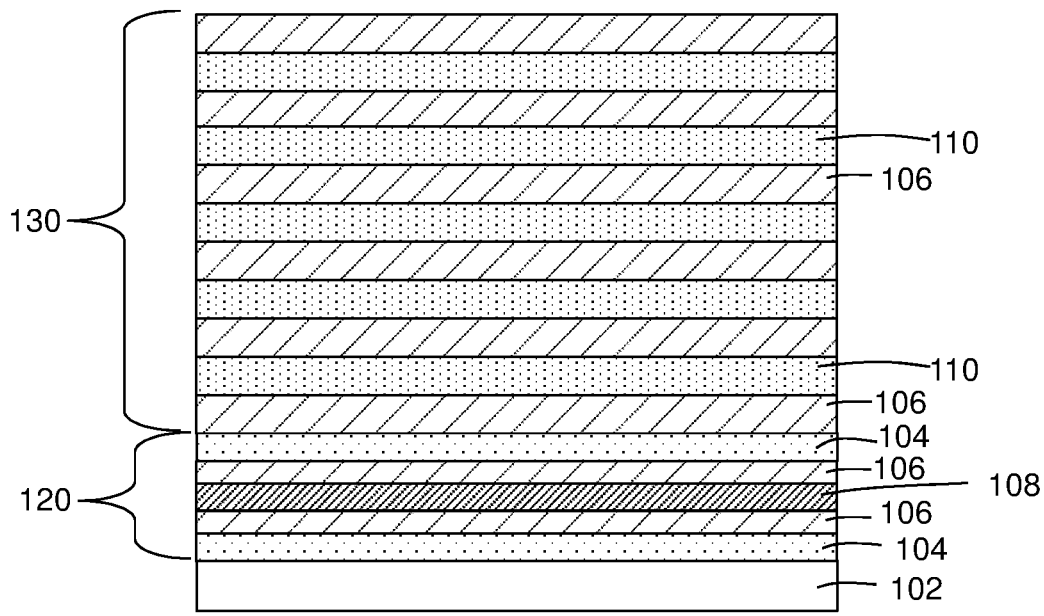
FIG. 2 illustrates a cross-sectional view of an electronic device with a memory stack according to one or more embodiments.

FIG. 2 illustrates an initial or starting memory stack of an electronic device 100 in accordance with one or more embodiments of the disclosure. In some embodiments, the electronic device 100 shown in FIG. 2 is formed on the bare substrate 102 in layers, as illustrated. The electronic device of FIG. 2 is made up of a substrate 102, a common source line 120, and a memory stack 112.

The substrate 102 can be any suitable material known to the skilled artisan. As used in this specification and the appended claims, the term "substrate" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

A common source line 120 is on the substrate 102. The common source like 120 may also be referred to as the semiconductor layers. The common source line 120 can be formed by any suitable technique known to the skilled artisan and can be made from any suitable material including, but not limited to, poly-silicon (poly-Si). In some embodiments, the common source line 120 comprises several different conductive or semiconductor materials. For example, in one or more embodiments, as illustrated in FIG. 2, the common source line 120 comprises a first poly-silicon layer 104 on the substrate 102. An oxide layer 106 can be formed on the first poly-silicon layer 104.

A sacrificial layer 108 may formed on the oxide layer 106 and can be made of any suitable material. The sacrificial layer 108 in some embodiments is removed and replaced in later processes. In some embodiments, the sacrificial layer 108 is not removed and remains within the memory device 100. In this case, the term "sacrificial" has an expanded meaning to include permanent layers and may be referred to as the conductive layer. In the illustrated embodiment, as described further below, the sacrificial layer 108 is removed in operation 60. In one or more embodiments, the sacrificial layer 108 comprises a material that can be removed selectively versus the neighboring oxide layer 106. A second oxide layer 106 may be formed on a top surface of the sacrificial layer 108, followed by the formation of a second poly-silicon layer 104 on the second oxide layer 106.

A memory stack 130 is formed on the common source line 120. The memory stack 130 in the illustrated embodiment comprises a plurality of alternating first layers 106 and second layers 110. In one or more embodiments, the first layers 106 comprise oxide layers and the second layers 110 comprise nitride layers. In some embodiments, the memory stack 130 comprises a non-replacement gate such as alternating oxide and poly-Si (OP), or oxide and metal, or oxide and sacrificial layer. The second layers 110 comprise a material that is etch selective relative to the first layers 106 so that the second layers 110 can be removed without substantially affecting the first layers 106. In one or more embodiments, the first layers 106 comprise silicon oxide ($SiO_x$). In one or more embodiments, the second layers 110 comprise silicon nitride (SiN). In one or more embodiments first layers 106 and second layers 110 are deposited by chemical vapor deposition (CVD) or physical vapor deposition (PVD).

The individual alternating layers may be formed to any suitable thickness. In some embodiments, the thickness of each second layer 110 is approximately equal. In one or more embodiments, each second layer 110 has a first second layer thickness. In some embodiments, the thickness of each first layer 134 is approximately equal. As used in this regard, thicknesses which are approximately equal are within +/−5% of each other. In some embodiments, a silicon layer (not shown) is formed between the second layers 110 and first layers 106. The thickness of the silicon layer may be relatively thin as compared to the thickness of a layer of second layers 110 or first layers 106. In one or more embodiments, the first layers 106 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments the first layer 106 has a thickness in the range of from about 0.5 to about 40 nm. In one or more embodiments, the second layers 110 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments, the second layer 110 has a thickness in the range of from about 0.5 to about 40 nm.

Figure 3:
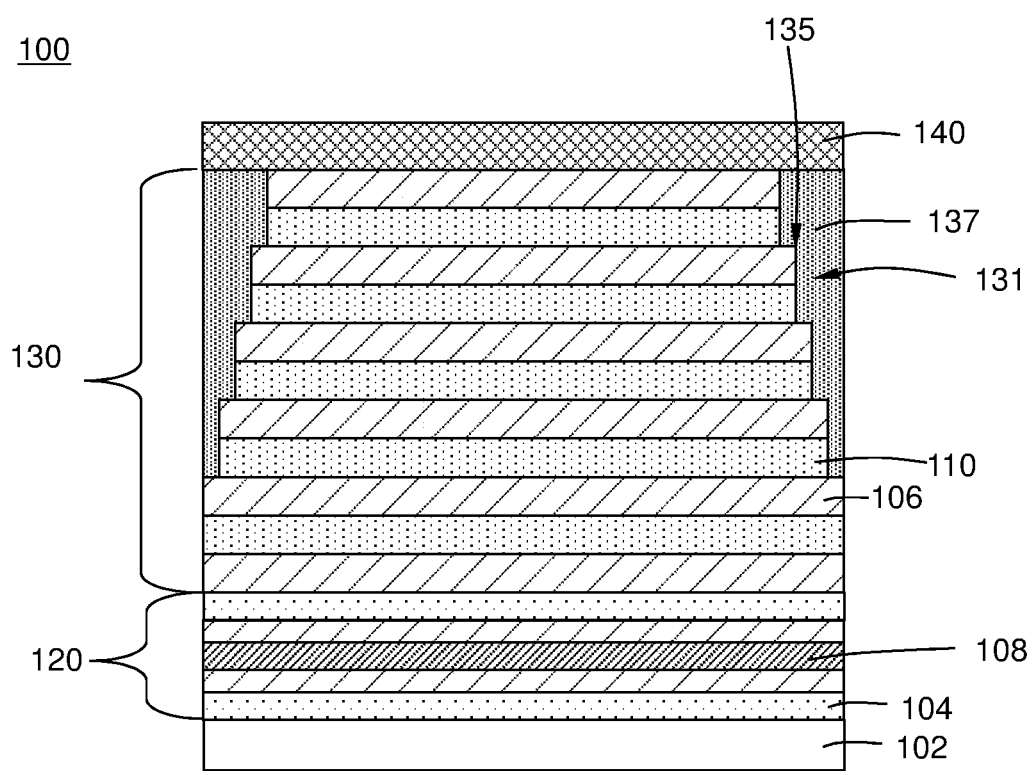
FIG. 3 illustrates a cross-sectional view of an electronic device after forming a staircase pattern of the memory stack according to one or more embodiments.

Referring to FIG. 3, at operation 20 of method 10, a staircase formation 131 is created. A mask layer 140 is deposited on the top surface of the memory stack 130. The mask layer 140 may comprise any suitable material known to the skilled artisan. In one or more embodiments the mask layer 140 comprises a nitride.

In one or more embodiments, the staircase formation 131 exposes a top surface 135 of the first layers 106. The top surface 135 can be used to provide space for word line contacts to be formed, as described below. A suitable fill material 137 can be deposited to occupy the space outside the staircase formation 131. A suitable fill material 137, as will be understood by the skilled artisan, can be any material that prevents electrical shorting between adjacent word lines. A staircase formation 131 with each word line having a smaller width (illustrated from left-to-right in the figures) than the word line below. Use of relative terms like "above" and "below" should not be taken as limiting the scope of the disclosure to a physical orientation in space.

Figure 4A:
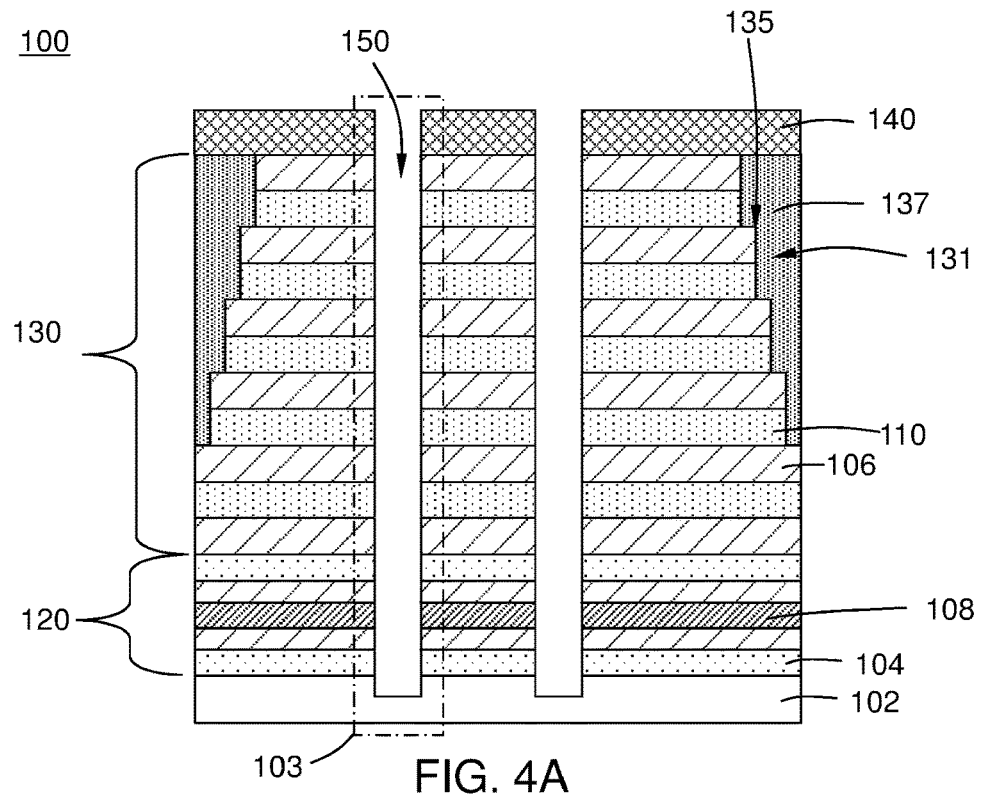
FIG. 4A illustrates a cross-sectional view of an electronic device according to one or more embodiments.
Figure 4B:
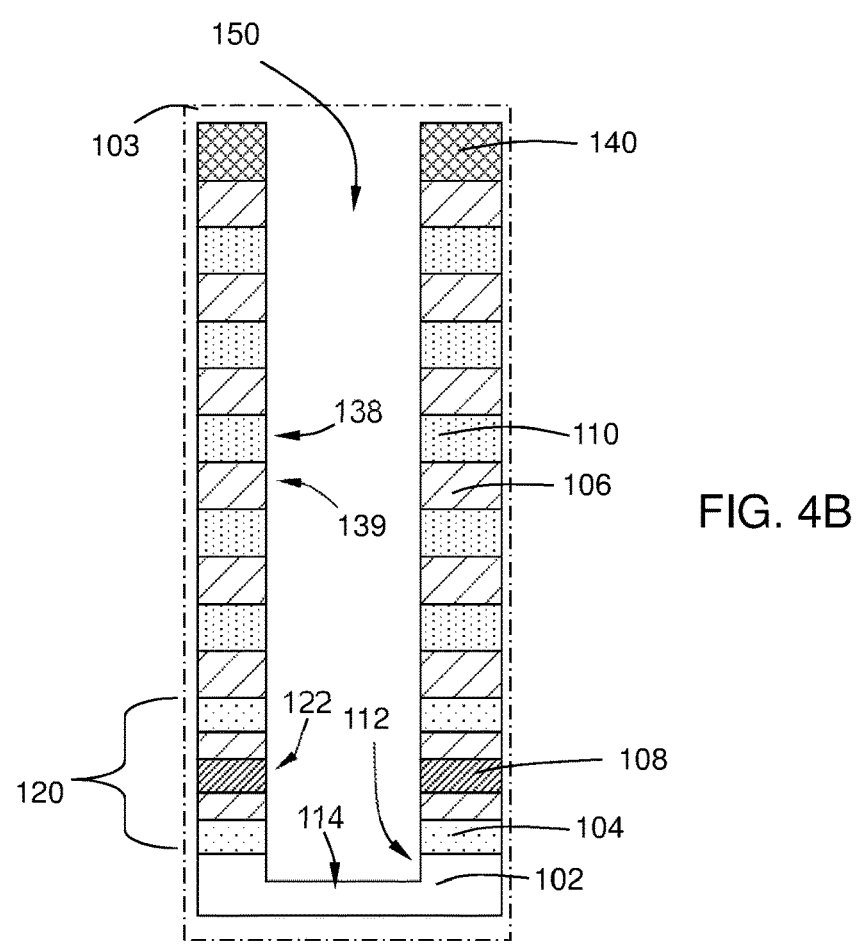
FIG. 4B illustrates an expanded view of region 103 of the substrate of FIG. 4A according to one of more embodiments.

Referring to FIGS. 4A and 4B, at operation 25 a memory hole channel 150 is opened through the memory stack 130. In some embodiments, opening the memory hole channel 150 comprises etching through the mask layer 140, memory stack 130, common source line 120, and into substrate 102. Referring to FIG. 4B, which is an expanded view of region 103, the memory hole channel 150 has sidewalls that extend through the memory stack 130 exposing surfaces 138 of the second layers 110 and surface 139 of the first layers 106.

The sacrificial layer 108 has surfaces 122 exposed as sidewalls of the memory hole channel 150. The memory channel hole 150 extends a distance into the substrate 102 so that sidewall surface 112 and bottom 114 of the memory hole channel 150 are formed within the substrate 102. The bottom 114 of the memory hole channel 150 can be formed at any point within the thickness of the substrate 102. In some embodiments, the memory hole channel 150 extends a thickness into the substrate 102 in the range of from about 10% to about 90%, or in the range of from about 20% to about 80%, or in the range of from about 30% to about 70%, or in the range of from about 40% to about 60% of the thickness of the substrate 102. In some embodiments, the memory hole channel 150 extends a distance into the substrate 102 by greater than or equal to 10%, 20%, 30%, 40%, 50%, 60%, 70% or 80% of the thickness of the substrate 102.

Figure 5A:
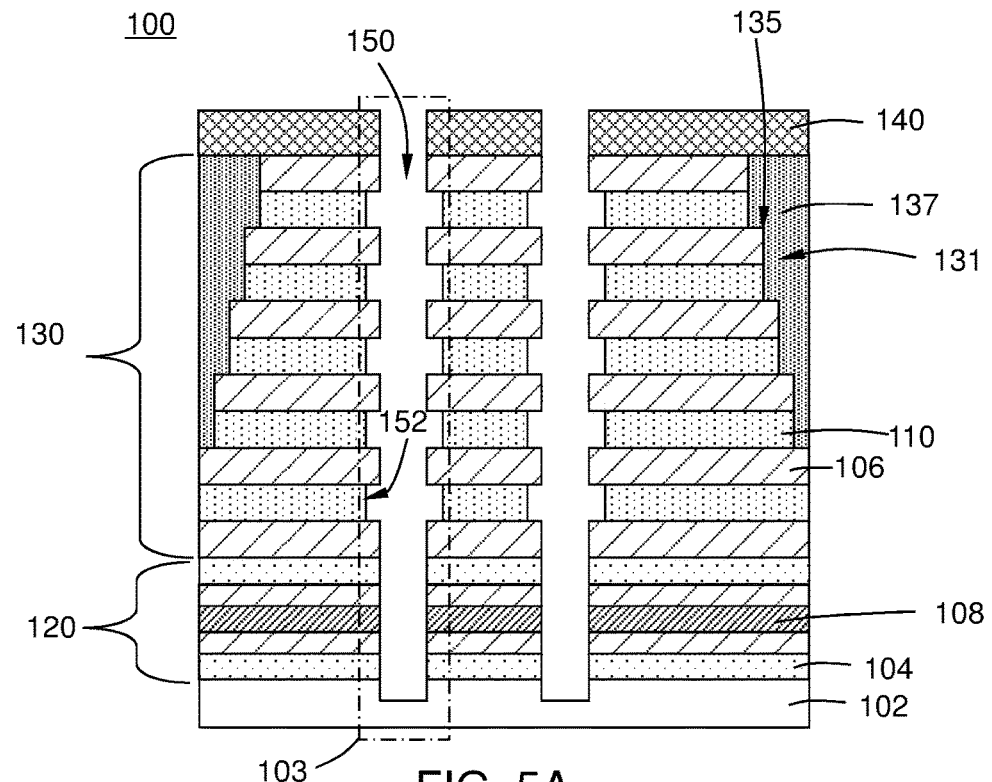
FIG. 5A illustrates a cross-sectional view of an electronic device according to one or more embodiments.
Figure 5B:
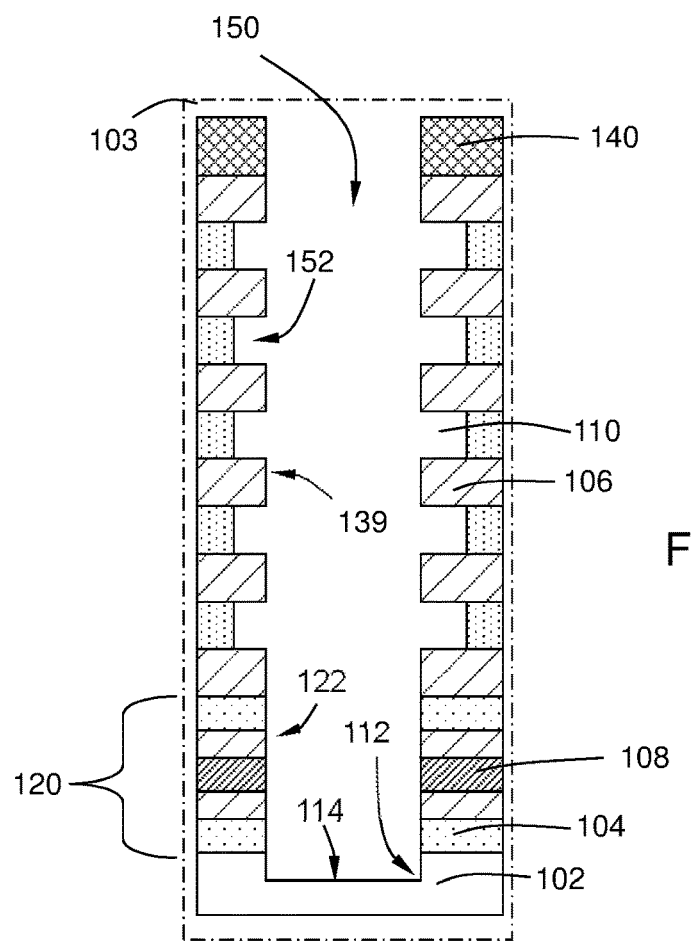
FIG. 5B illustrates an expanded view of region 103 according to one or more embodiments.

FIG. 5A shows operation 30 in which the second layers 110, e.g., nitride layers, are selectively recessed through the memory hole channel 150 to form a recessed region 152. FIG. 5B is an expanded view of region 103 of FIG. 5A. In one or more embodiments, the second layers 110, e.g., nitride layers, are recessed through the opening 150 using a reactive species that is formed via a remote plasma from a process gas comprising oxygen ($O_2$) and nitrogen trifluoride ($NF_3$). In other embodiments, the second layers 110, e.g., nitride layers, are recessed through the opening 150 using hot phosphorus (HP).

Figure 6A:
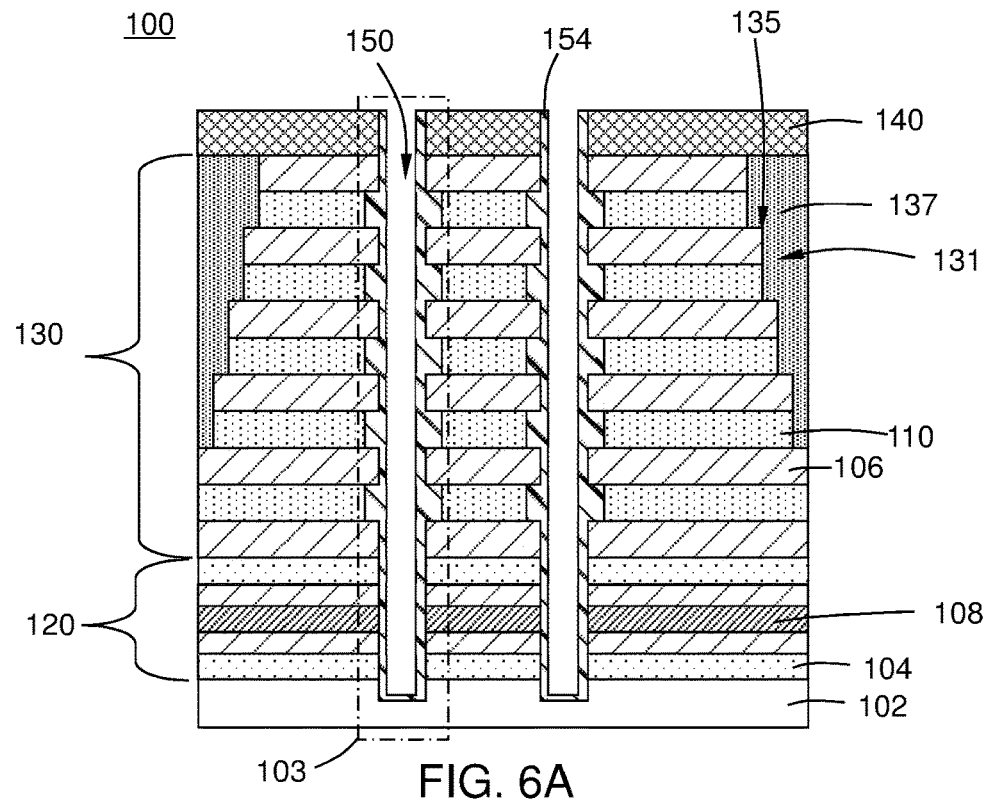
FIG. 6A illustrates a cross-sectional view of an electronic device according to one or more embodiments.
Figure 6B:
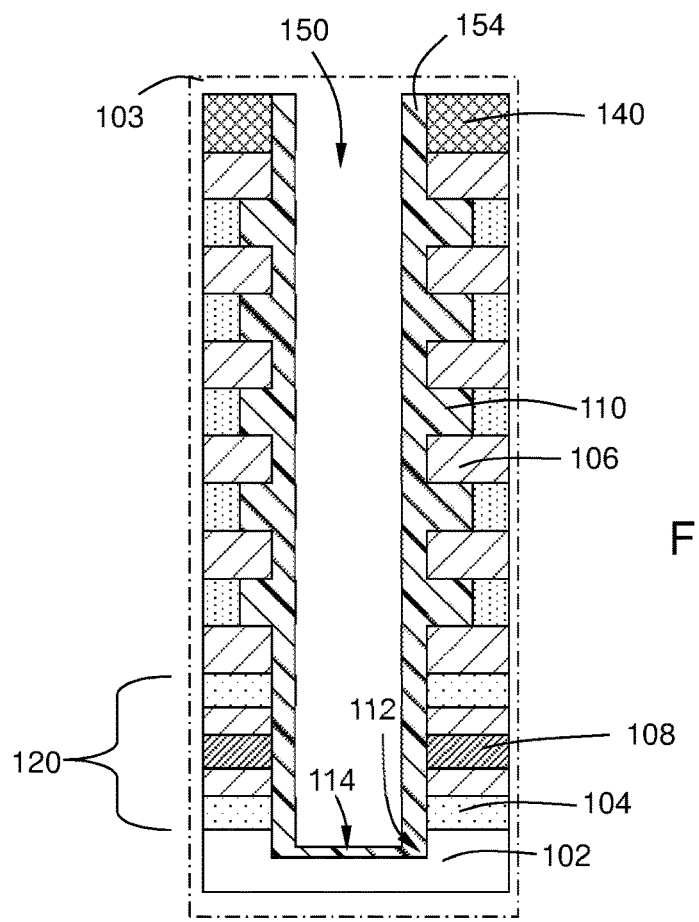
FIG. 6B illustrates an expanded view of region 103 according to one or more embodiments.

FIGS. 6A and 6B show operation 35 in which a poly-silicon layer 154 is deposited in the memory hole 150 to fill the recessed region 152. FIG. 6B is an expanded view of region 103. The poly-silicon layer 154 may be deposited by any suitable means known to the skilled artisan including, but not limited to, atomic layer deposition (ALD) or chemical vapor deposition (CVD). In some embodiments, the poly-silicon layer 154 may also be referred to as a deposition-enabling layer (DEL).

Figure 7A:
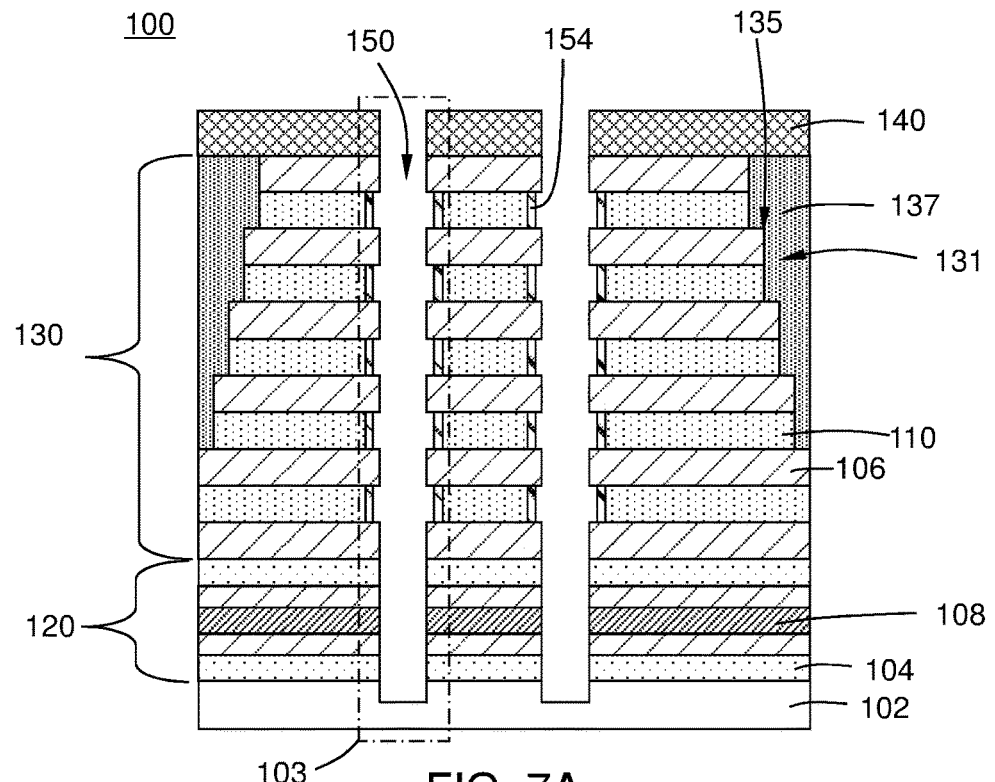
FIG. 7A illustrates a cross-sectional view of an electronic device according to one or more embodiments.
Figure 7B:
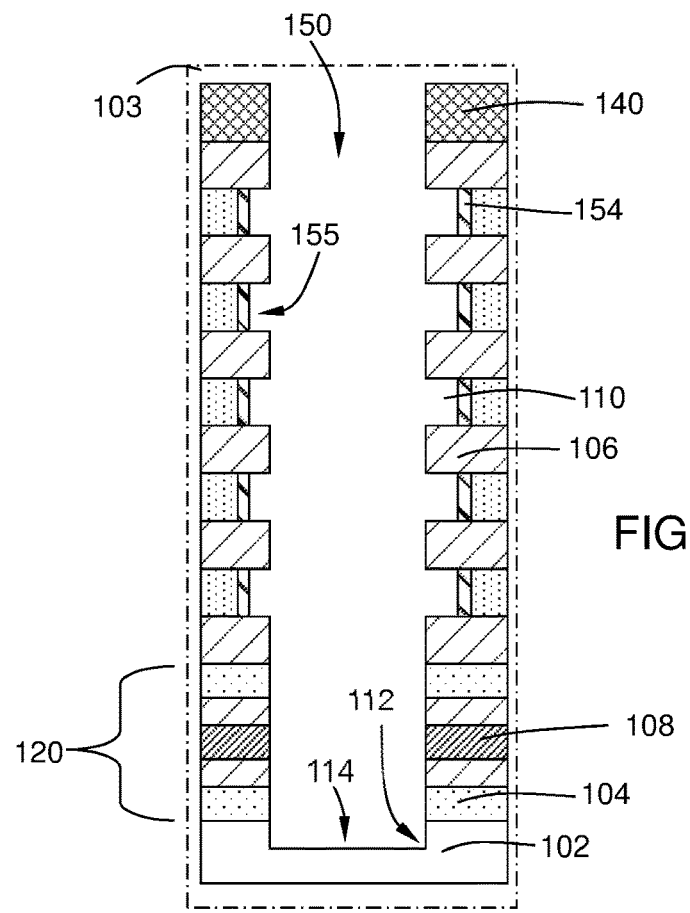
FIG. 7B illustrates an expanded view of region 103 according to one or more embodiments.

FIGS. 7A and 7B show operation 40 in which the poly-silicon layer 154 is recessed to form a recessed region 155. FIG. 7B is an expanded view of region 103. The poly-silicon layer 154 is removed from the sidewall surface 112 and bottom 114 of the memory hole channel 150.

Figure 8A:
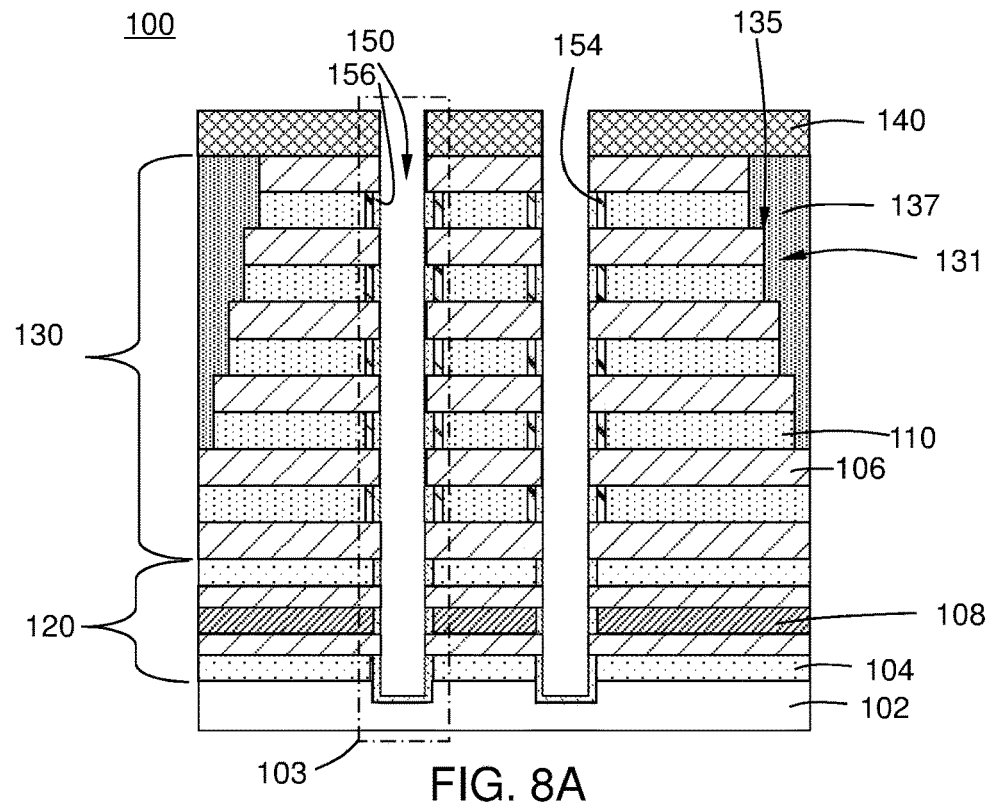
FIG. 8A illustrates a cross-sectional view of an electronic device according to one or more embodiments.
Figure 8B:
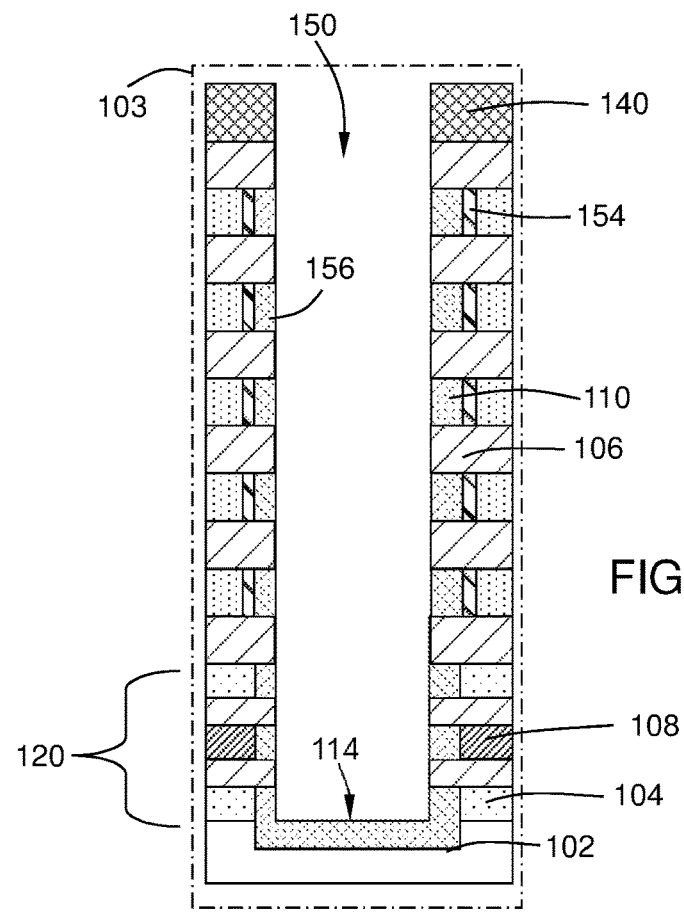
FIG. 8B illustrates an expanded view of region 103 according to one or more embodiments.

FIGS. 8A and 8B show operation 45 in which a trap layer 156 is selectively deposited on the polysilicon layer 154 in the recess region 155, as well as on the side wall surface 112 of the sacrificial layer 108 and the oxide layer 104 of the common source line 120, and on the bottom surface 114 of the memory hole 150. FIG. 8B is an expanded view of region 103. In one or more embodiments, the trap layer 156 may comprise any suitable material known to the skilled artisan. In some embodiments, the trap layer 156 comprises silicon nitride (SiN). In one or more embodiments, the trap layer 156 is deposited by atomic layer selective deposition on the hydrogen-terminated poly-silicon layer 154. In one or more embodiments, the trap layer 156 is deposited by an alternating supply of dichlorosilane ($SiH_2Cl_2$) and ammonia ($NH_3$). Without intending to be bound by theory, it is thought that the trap layer 156 advantageously forms only on the hydrogen-terminated surface of the poly-silicon layer 154 and not on the sidewall surface of the first layer 106 because there are no Si—$H_x$ and N—$H_y$ bonds on the surface of the first layer 106. In one or more embodiments, the trap layer 156 has improved film quality when compared to a trap layer formed using an ammonia ($NH_3$) plasma.

Figure 9A:
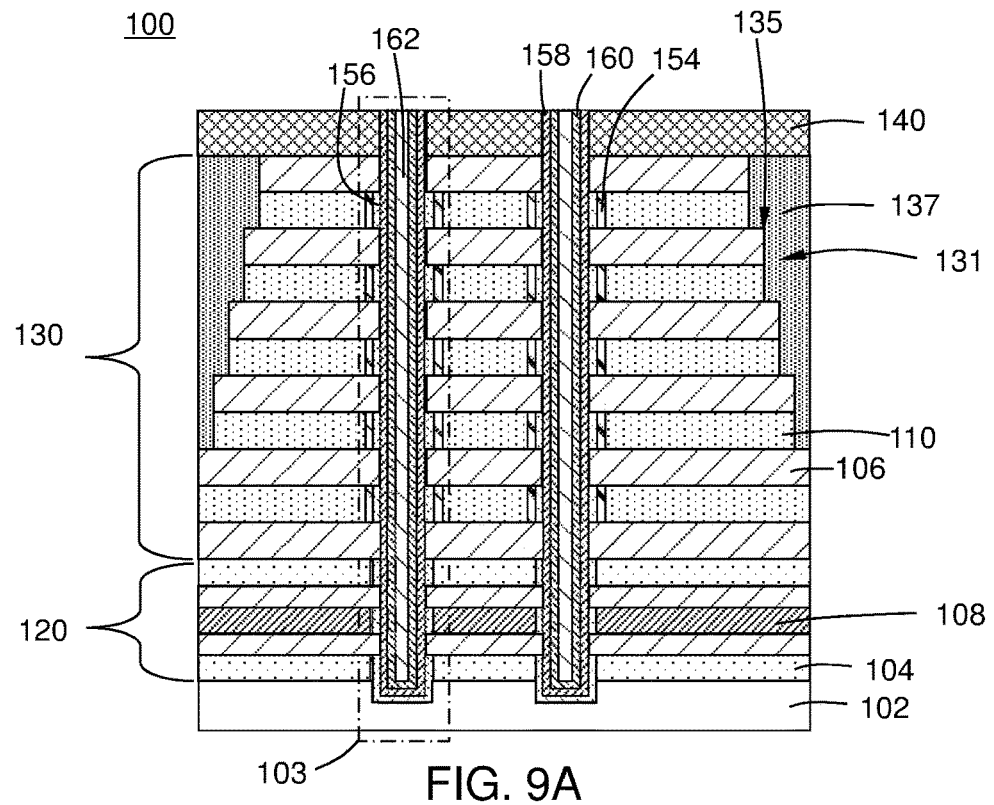
FIG. 9A illustrates a cross-sectional view of an electronic device according to one or more embodiments.
Figure 9B:
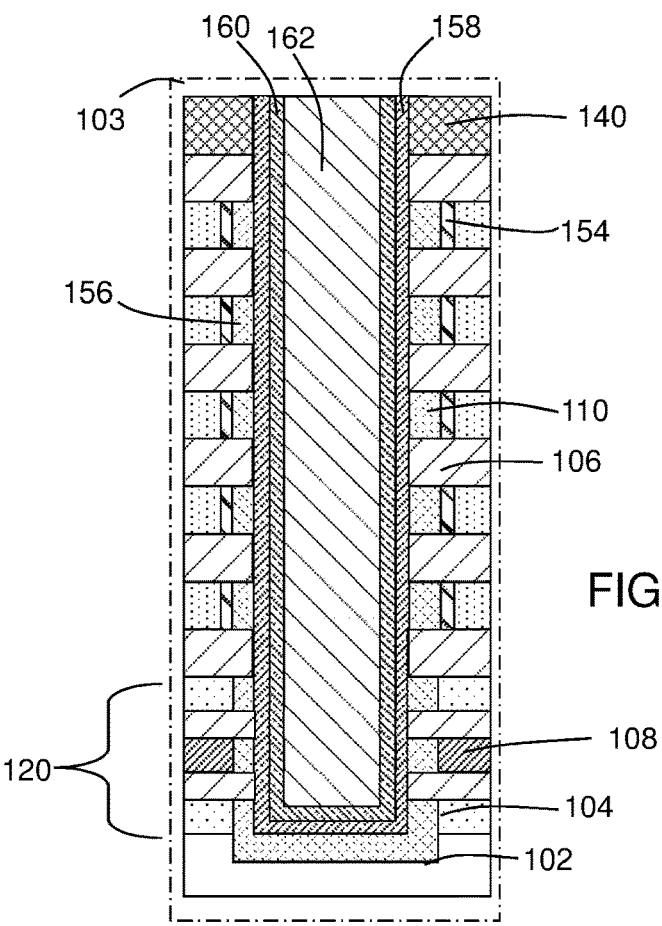
FIG. 9B illustrates an expanded view of region 103 according to one or more embodiments.

FIGS. 9A and 9B show operation 50 in which transition layers are conformally deposited into memory hole channel 150 adjacent the trap layer 156. FIG. 9B is an expanded view of region 103. The transistor layers can be formed by any suitable technique known to the skilled artisan. In some embodiments, the transistor layers are formed by a conformal deposition process. In some embodiments, the transistor layers are formed by one or more of atomic layer deposition or chemical vapor deposition.

In one or more embodiments, the deposition of the transistor layers is substantially conformal. As used herein, a layer which is "substantially conformal" refers to a layer where the thickness is about the same throughout (e.g., on the top, middle and bottom of sidewalls and on the bottom of the memory hole channel 150). A layer which is substantially conformal varies in thickness by less than or equal to about 5%, 2%, 1% or 0.5%.

Referring to FIG. 9B, which is an expanded view of region 103, in one or more embodiments, the transistor layers comprise a tunnel oxide layer 158 and a poly-silicon channel layer 160 on the tunneling oxide layer 158 in the memory hole channel 150. In one or more embodiments, the tunneling oxide layer 158 and the poly-silicon channel layer 160 are deposited in the memory hole channel 150 on the sidewalls of the memory hole channel 150 or on the trap layer 156.

The tunnel oxide layer 158 and the poly-silicon channel layer 160 can have any suitable thickness depending on, for example, the dimensions of the memory hole channel 150. In some embodiments, the poly-silicon layer 160 has a thickness in the range of from about 0.5 nm to about 50 nm, or in the range of from about 0.75 nm to about 35 nm, or in the range of from about 1 nm to about 20 nm. In some embodiments, the poly-silicon layer 160 is a continuous film. In one or more embodiments, the poly-silicon layer 160 is formed with conformal deposition on the tunnel oxide layer 158, the poly-silicon layer 160 having a thickness in a range of from about 1 nm to about 20 nm. In one or more embodiments, the memory hole channel 150 is then filled with a dielectric material 162. The dielectric material 162 may comprise any suitable dielectric material known to the skilled artisan. As used herein, the term "dielectric material" refers to an electrical insulator that can be polarized in an electric field. In some embodiments, the dielectric material 162 comprises one or more of oxides, carbon doped oxides, silicon dioxide ($SiO_2$), porous silicon dioxide ($SiO_2$), silicon dioxide ($SiO_2$), silicon nitride (SiN), silicon dioxide/silicon nitride, carbides, oxycarbides, nitrides, oxynitrides, oxycarbonitrides, polymers, phosphosilicate glass, fluorosilicate (SiOF) glass, or organosilicate glass (SiOCH).

Figure 10A:
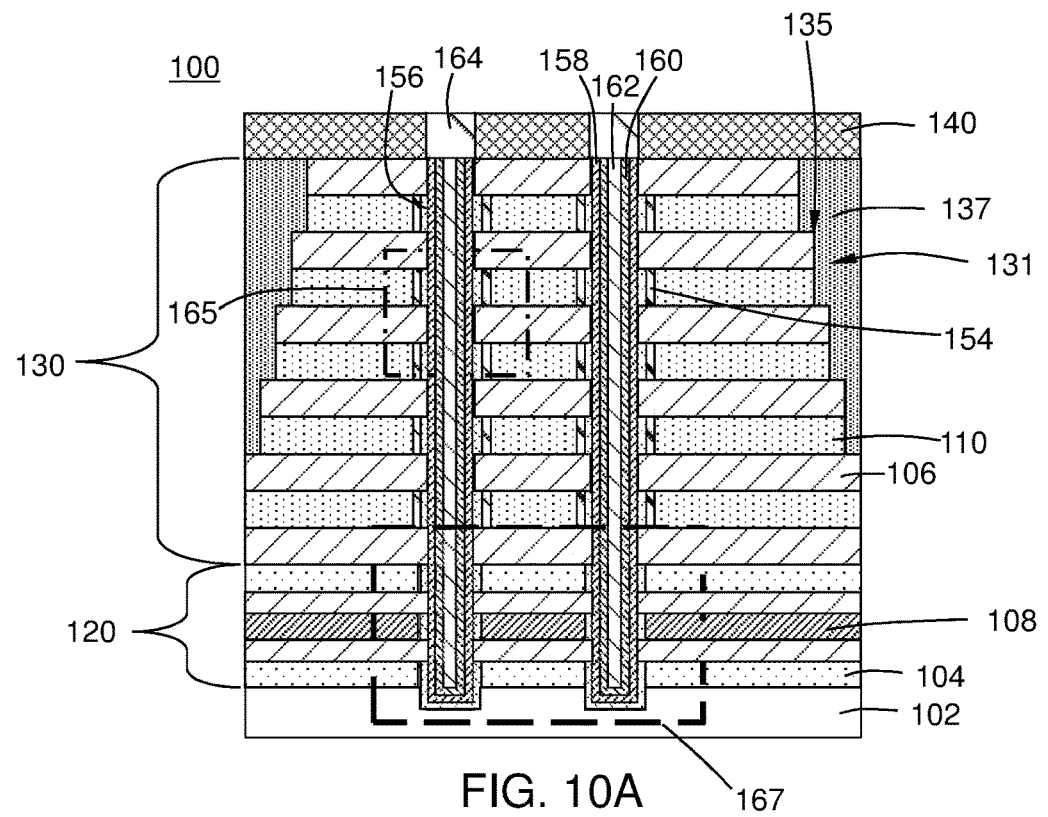
FIG. 10A illustrates a cross-sectional view of an electronic device according to one or more embodiments.
Figure 10B:
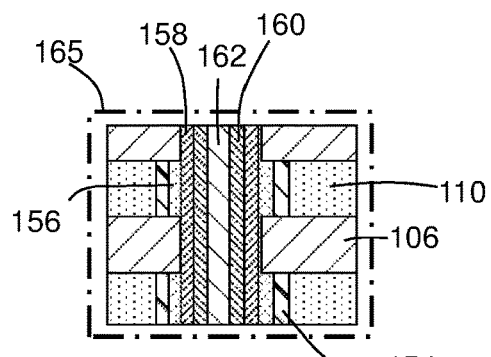
FIG. 10B illustrates an expanded view of region 165 according to one or more embodiments.
Figure 10C:
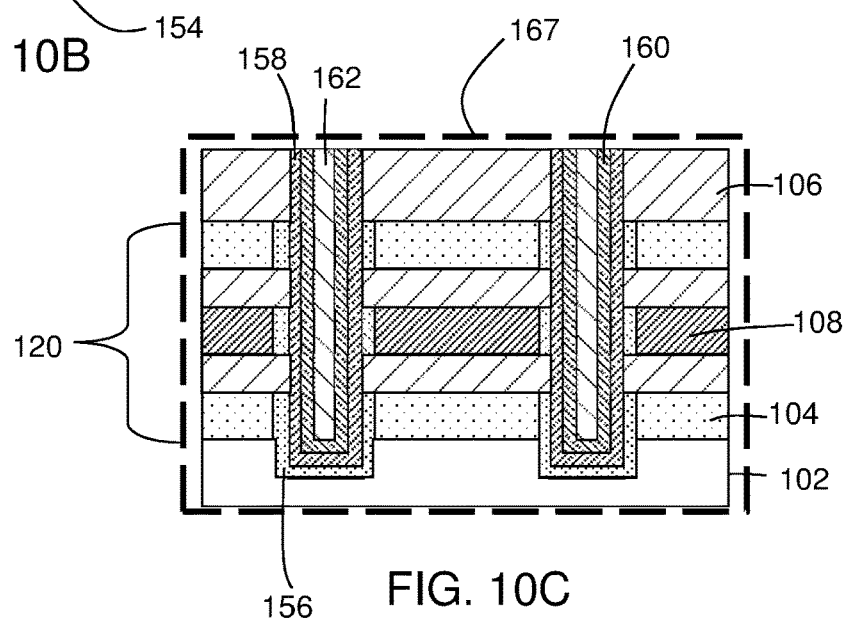
FIG. 10C illustrates an expanded view of region 167 according to one or more embodiments.

FIGS. 10A-10C shows operation 55 of method 10 where a bit line pad 164 is formed in the mask layer 140. The bit line pad 164 can be any suitable material known to the skilled artisan including, but not limited to, poly-silicon.

Referring to FIG. 10B, which is an expanded view of region 165, in one or more embodiments, the cell 165 comprises poly-silicon layer 154 and trap layer 156 adjacent the memory hole 150 which is filled with tunnel oxide layer 158, poly-silicon layer 160, and dielectric material 162.

Referring to FIG. 10C, which is an expanded view of region 167, in one or more embodiments, the bottom region of the memory hole comprises trap layer 156 lining the bottom of the memory hole 150, with tunnel oxide layer 158 adjacent the trap layer 156, poly-silicon layer 160 on the tunnel oxide layer, and dielectric material 162 filling the memory hole 150.

Figure 11:
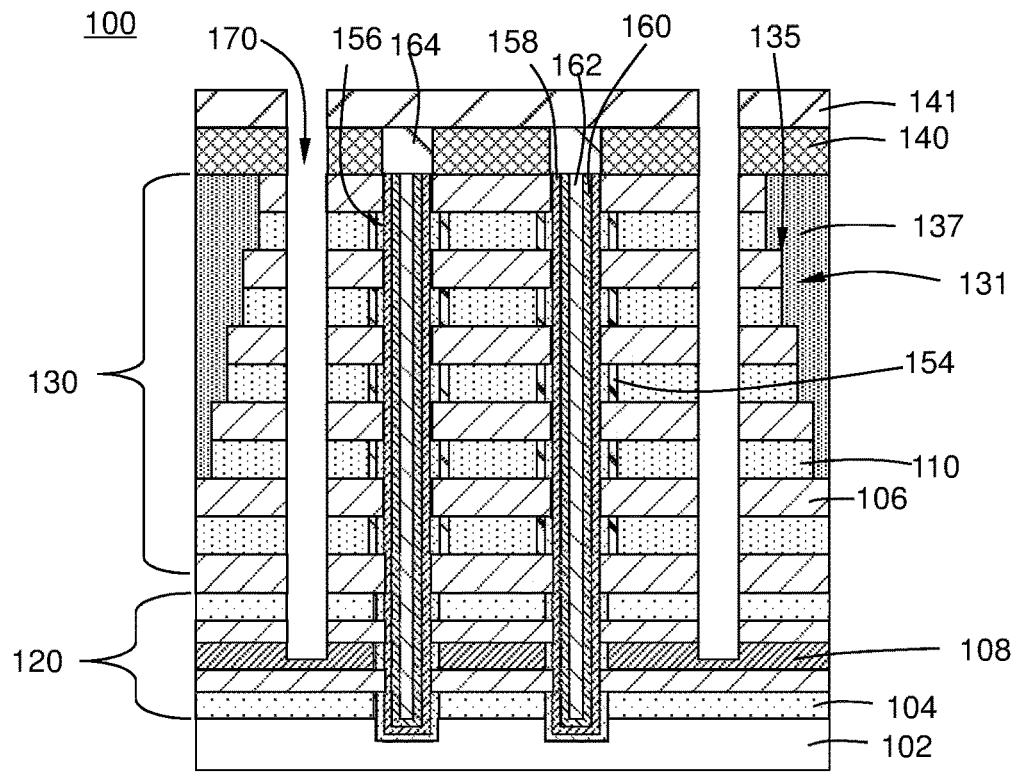
FIG. 11 illustrates a cross-sectional view of an electronic device according to one or more embodiments.

FIG. 11 shows operation 55 of method 10 where an interlayer dielectric 141 is deposited on a top surface of the mask layer 140 and the bit line pad 164. The interlayer dielectric (ILD) 141 may be deposited by any suitable technique known to one of skill in the art. The interlayer dielectric 141 may comprise any suitable material known to one of skill in the art. In one or more embodiments, the interlayer dielectric 141 is a low-K dielectric that includes, but is not limited to, materials such as, e.g., silicon dioxide, silicon oxide, carbon doped oxide ("CDO"), e.g., carbon doped silicon dioxide, porous silicon dioxide (SiO$_2$), silicon nitride (SiN), or any combination thereof. While the term "silicon oxide" may be used to describe the interlayer dielectric 141, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g., silicon nitride, silicon oxynitride, aluminum oxide, zirconium oxide, and the like.

Referring to FIG. 11, at operation 55 of method 10, the memory stack 130 is slit patterned to form slit pattern openings 170 that extend from a top surface of the interlayer dielectric 141 to the sacrificial layer 108 of the common source line 120.

Figure 12:
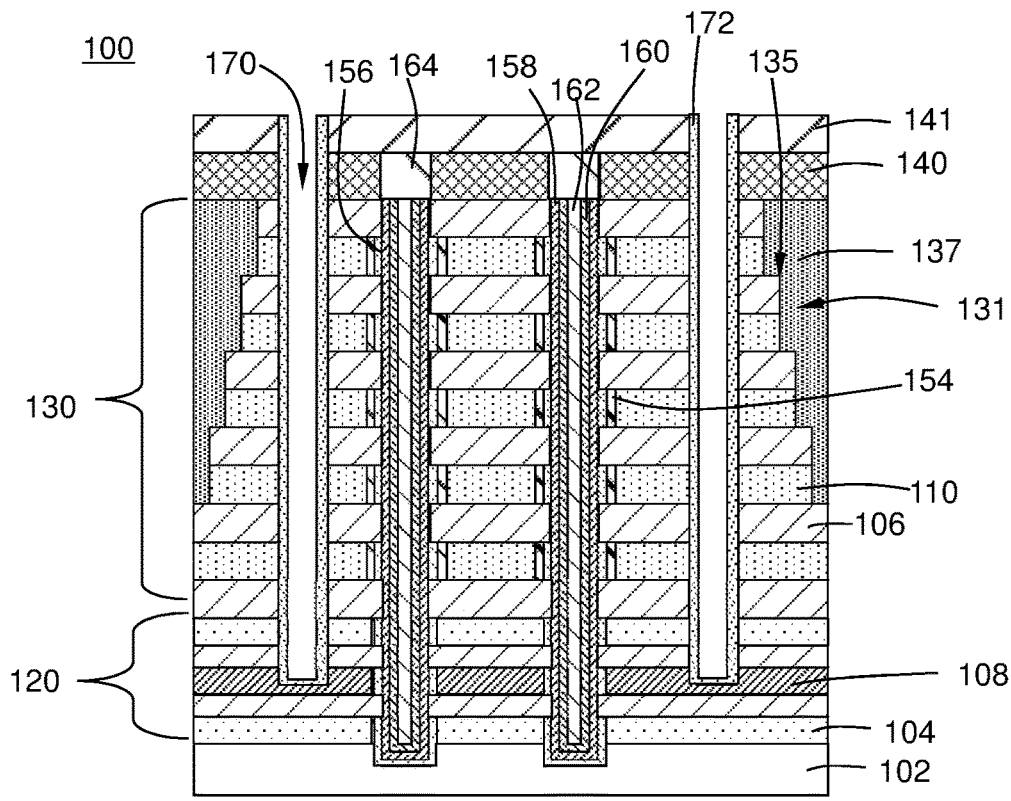
FIG. 12 illustrates a cross-sectional view of an electronic device according to one or more embodiments.

FIG. 12 shows a spacer material 172 is deposited in the slit pattern openings 170 and is then etched back such that the space material 172 is formed on the side walls of the slit pattern openings 170. The spacer material 172 may comprise any suitable material known to the skilled artisan. In one or more embodiments, the spacer material 172 comprises polysilicon.

Figure 13:
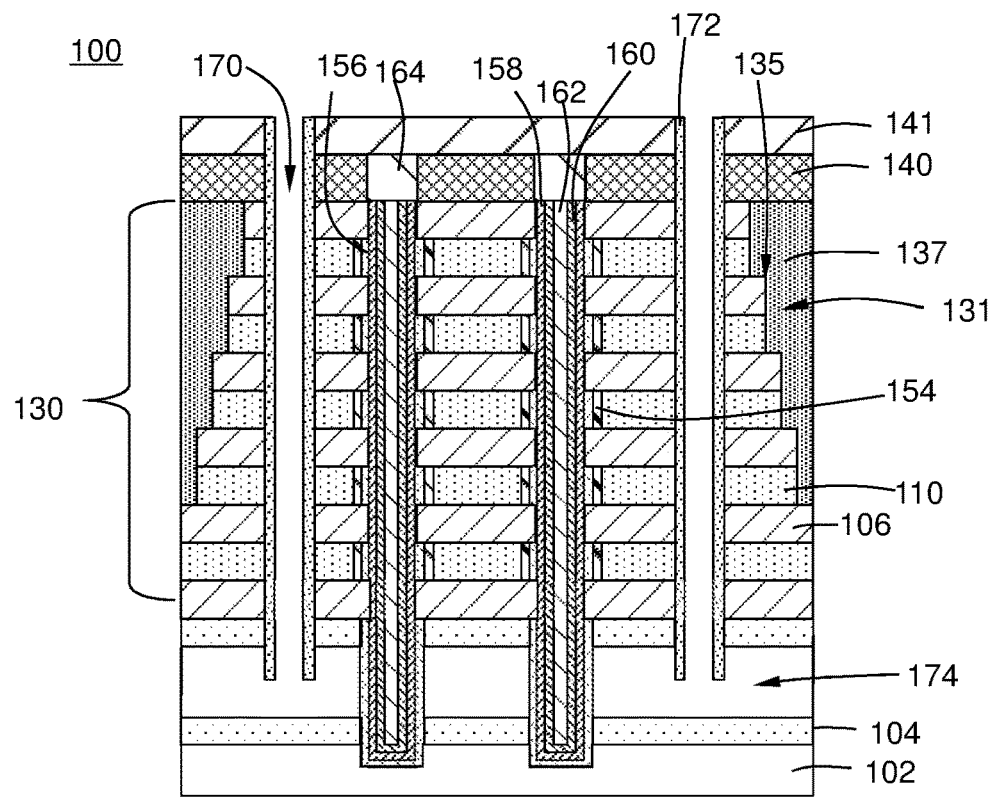
FIG. 13 illustrates a cross-sectional view of an electronic device according to one or more embodiments.

FIG. 13 shows operation 60 of method 10 where the sacrificial layer 108 and the oxide layer 106 directly adjacent to the sacrificial layer 108 in the common source lice 120 are removed. The sacrificial layer 108 can be removed by any suitable technique known to the skilled artisan including, but not limited to, selective etching, hot phosphoric acid, and the like.

Figure 14:
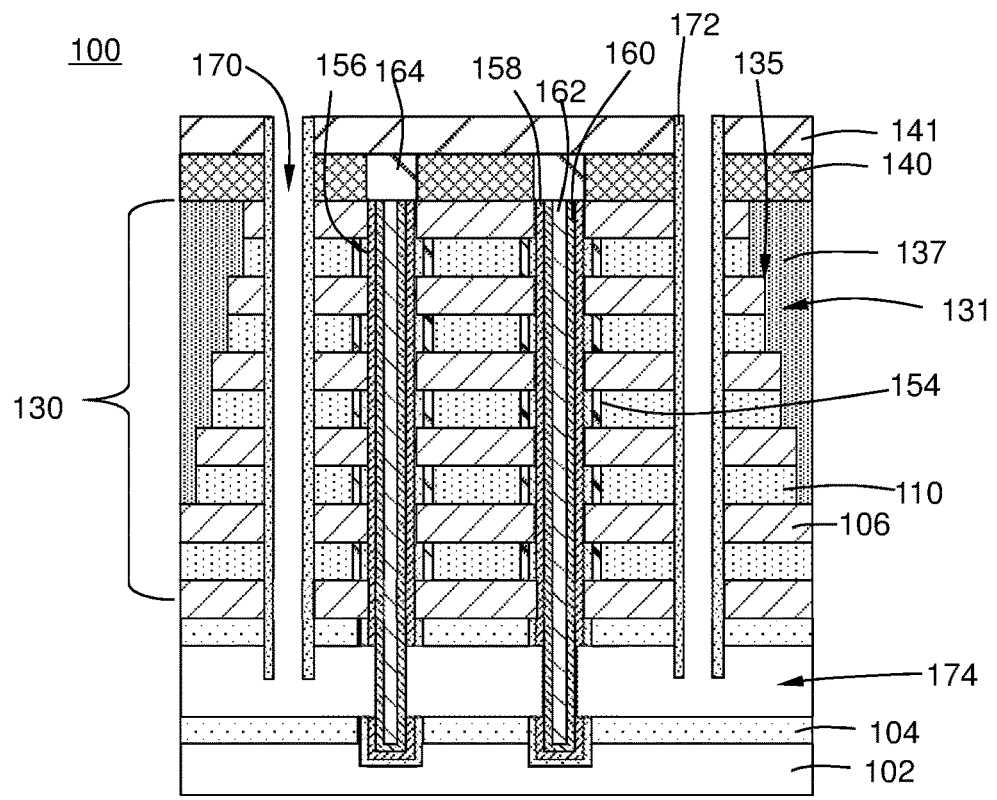
FIG. 14 illustrates a cross-sectional view of an electronic device according to one or more embodiments.

FIG. 14 shows the poly-silicon channel 160 being exposed on the common source line 120 contact. The poly-silicon channel 160 is exposed by removing the trap layer 156 and the tunnel oxide layer 158 in the common source line 120 contact region.

Figure 15:
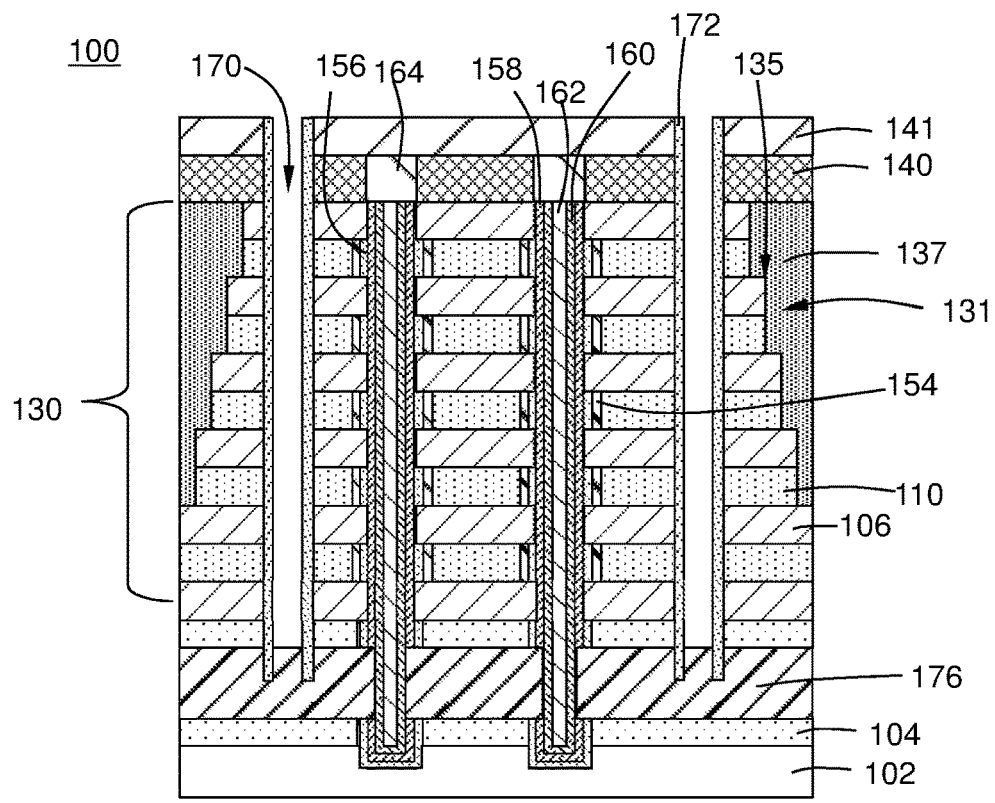
FIG. 15 illustrates a cross-sectional view of an electronic device according to one or more embodiments.

FIG. 15 shows operation 60 of method 10 where the common source line is filled with a poly-silicon layer 176. The poly-silicon layer 176 may be doped or undoped.

Figure 16:
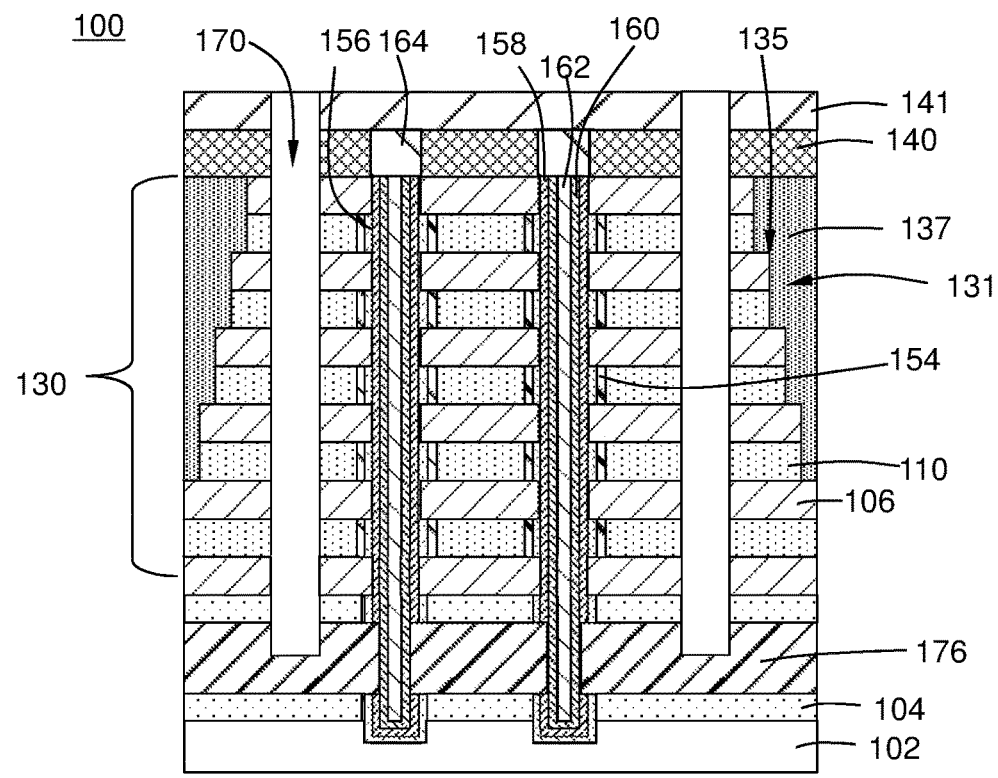
FIG. 16 illustrates a cross-sectional view of an electronic device according to one or more embodiments.

FIG. 16 shows the removal of the spacer material 172 from the slit pattern opening 170. The spacer material 172 may be removed by any suitable means known to the skilled artisan. In one or more embodiments, the spacer material 172 is removed by an isotropic etch process (e.g., wet etching using tetramethyl ammonium hydroxide (TMAH) or the like).

Figure 17:
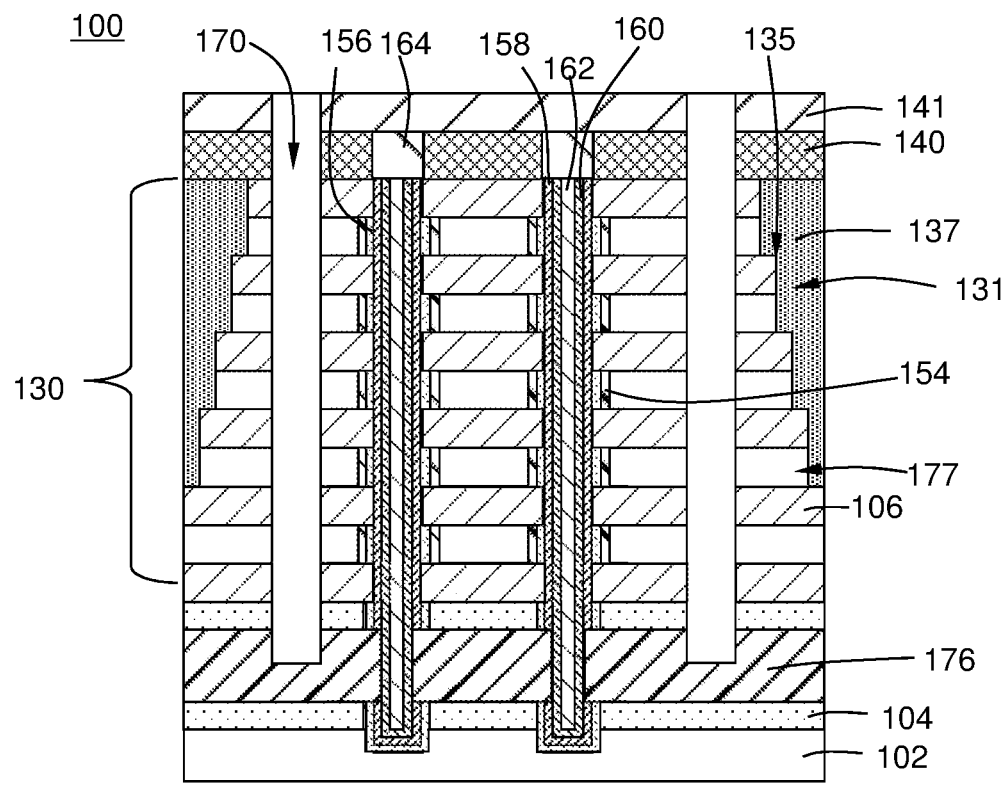
FIG. 17 illustrates a cross-sectional view of an electronic device according to one or more embodiments.

FIG. 17 shows operation 65 of method 10 where one or more of the second layer (e.g., nitride) 110 are removed to form openings 177.

Figure 18:
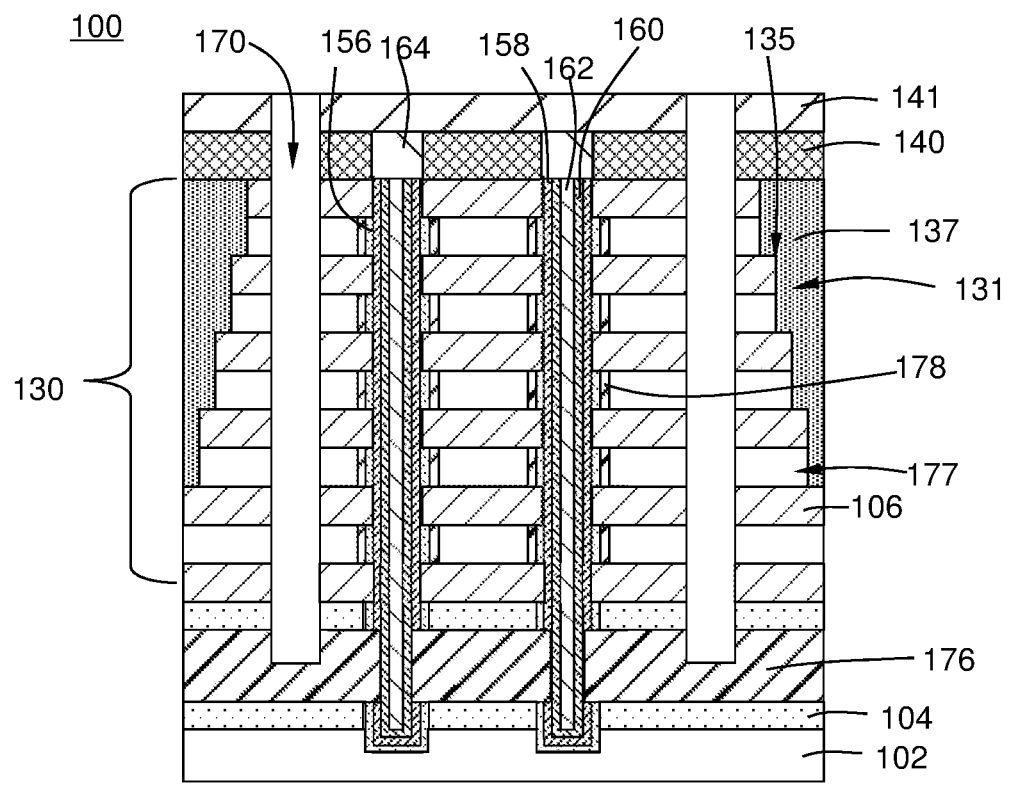
FIG. 18 illustrates a cross-sectional view of an electronic device according to one or more embodiments.

FIG. 18 shows operation 70 where in removing one or more of the second layers 110, e.g., nitride layers, the first side of the second layers 110, e.g., nitride layers, are exposed to the slit pattern opening 170, and the first side of the second layers 110, e.g., nitride layers, are exposed to an oxidant through the slit pattern opening 170 to oxidize the poly-silicon 154 to form blocking oxide layer 178.

Figures 19, 20A:
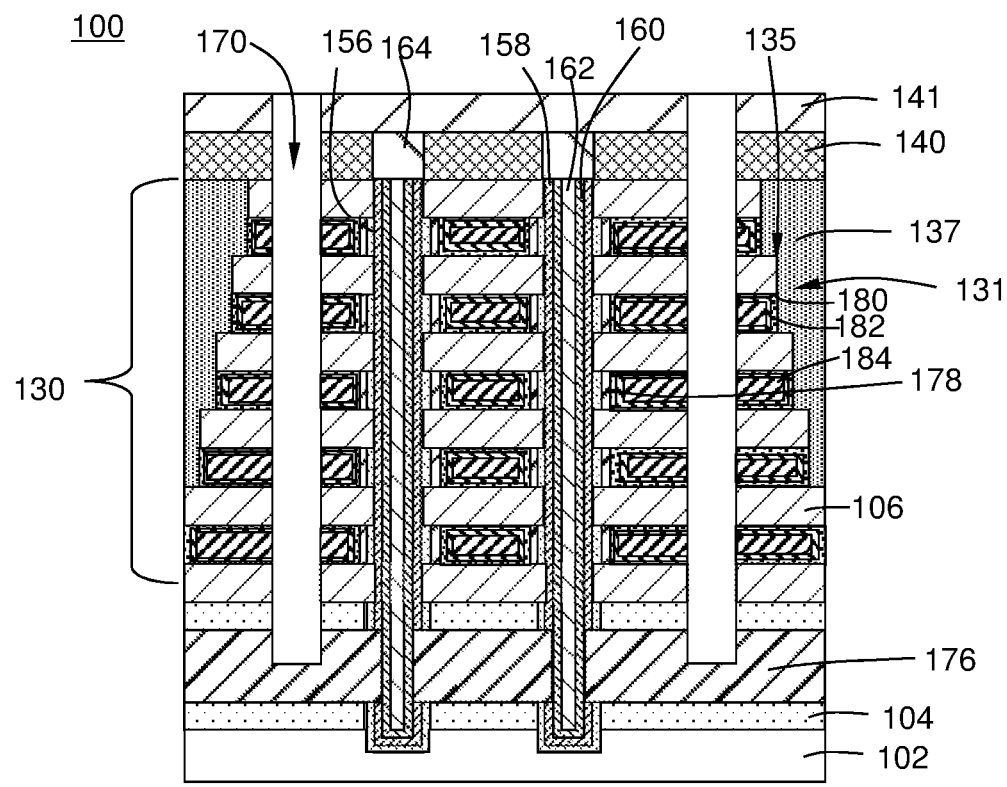
FIG. 19 illustrates a cross-sectional view of an electronic device according to one or more embodiments.
FIG. 20A illustrates a cross-sectional view of an electronic device according to one or more embodiments.

FIG. 19 shows operation 75 of method 10 where the word lines are formed. The word lines comprise one or more of an oxide layer 180, a barrier layer 182, and a word line metal 184. The oxide layer 180 may comprise any suitable material known to the skilled artisan. In one or more embodiments, the oxide layer comprises aluminum oxide. The barrier layer 182 may comprise any suitable material known to the skilled artisan. In one or more embodiments, the barrier layer 182 comprises one or more of titanium nitride (TiN), tantalum nitride (TaN), or the like. In one or more embodiments, the word line metal 182 comprises a bulk metal comprising one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh). In one or more embodiments, the word line metal 184 comprises tungsten (W). In other embodiments, the word line metal 184 comprises ruthenium (Ru).

Figure 20B:
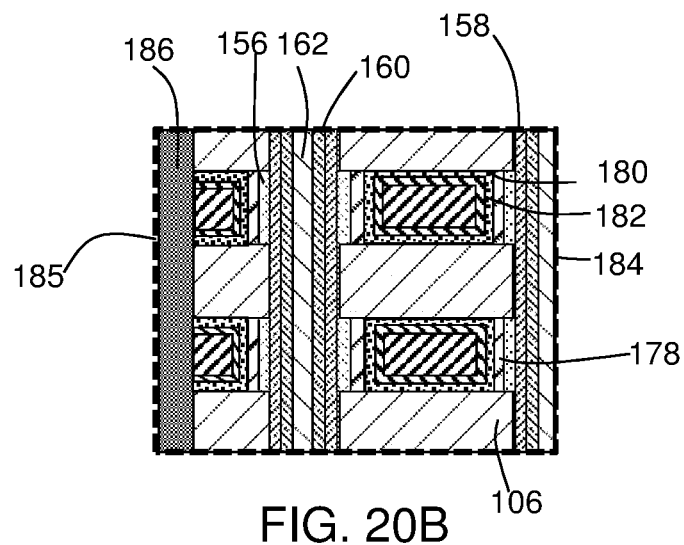
FIG. 20B illustrates an expanded view of region 185 according to one or more embodiments.
Figure 20C:
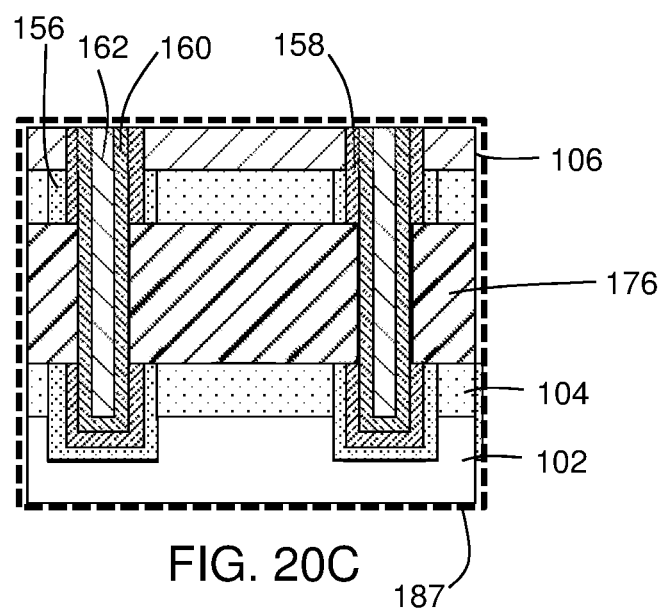
FIG. 20C illustrates an expanded view of region 187 according to one or more embodiments.

FIGS. 20A-20C shows operation 80 of method 10 where the slit pattern opening 170 is filled with a fill material 186. FIG. 20B is an expanded view of region 185. FIG. 20C is an expanded view of region 187. The fill material 186 may be any suitable material known to one of skill in the art. In one or more embodiments, the fill material 186 comprises one or more of a dielectric material or a conductor material. As used herein, the term "dielectric material" refers to a layer of material that is an electrical insulator that can be polarized in an electric field. In one or more embodiments, the dielectric material comprises one or more of oxides, carbon doped oxides, silicon oxide (SiO$_x$), porous silicon dioxide (SiO$_2$), silicon nitride (SiN), silicon oxide/silicon nitride, carbides, oxycarbides, nitrides, oxynitrides, oxycarbonitrides, polymers, phosphosilicate glass, fluorosilicate (SiOF) glass, or organosilicate glass (SiOCH).

In one or more embodiments, the trap layer 156 is advantageously confined only between the blocking oxide 178 and the word line. Cell to cell interference and lateral spreading are advantageously suppressed. In one or more embodiments, selective deposition of the trap layer 156 advantageously suppresses variations in shape and thickness of the trap layer 156.

Figure 21:
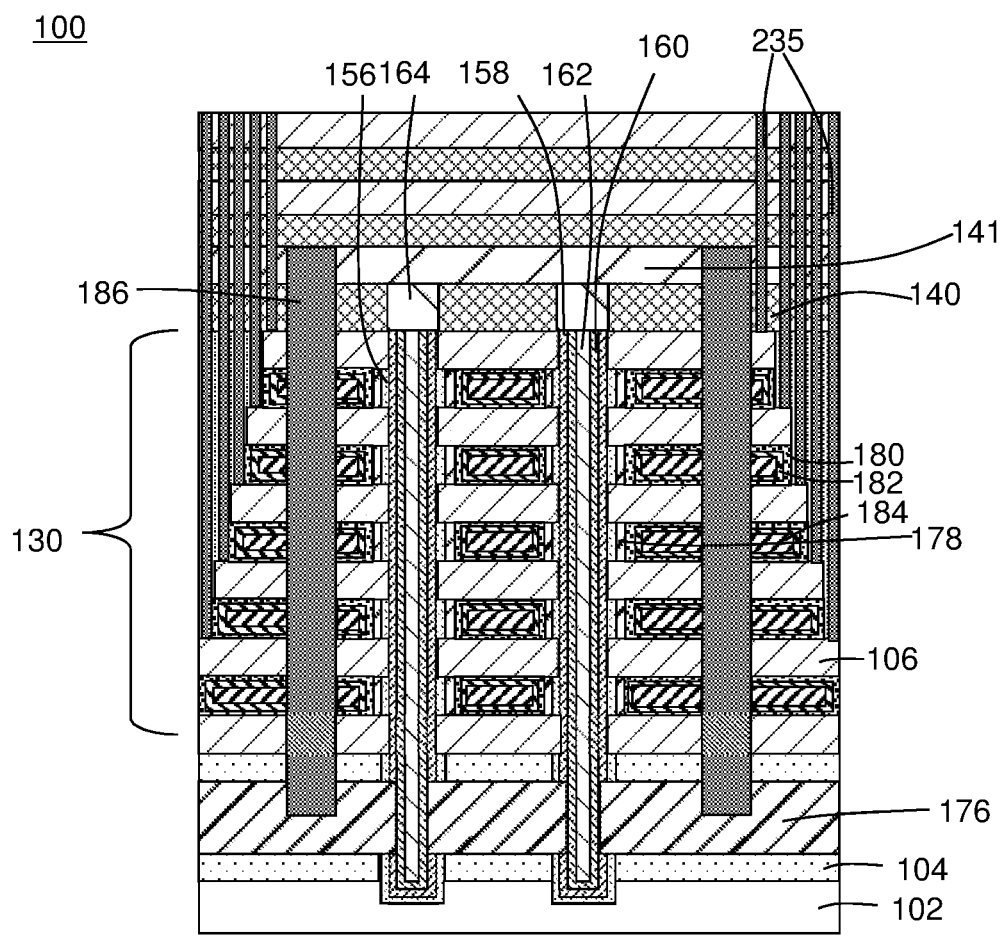
FIG. 21 illustrates a cross-sectional view of an electronic device according to one or more embodiments.

FIG. 21 shows operation 85 of method 10 where the word line (W/L) contacts are formed. The word line contacts 235 extend through the memory stack 130 a distance sufficient to terminate at one of the word lines. In one or more embodiments, the word line contacts 235 can comprise any suitable material known to the skilled artisan. In one or more embodiments, the word line contact 235 comprises one or more of a metal, a metal silicide, poly-silicon, amorphous silicon, or EPI silicon. In one or more embodiments, the word line contact is doped by either N type dopants or P type dopants in order to reduce contact resistance. In one or more embodiments, the metal of the word line contact 235 is selected from one or more of copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt).

In one or more embodiments, a method of forming an electronic device comprises removing one or more first layers from a film stack comprising alternating second layers and first layers, the first layers removed from a first side of the first layers to leave an opening bounded on a second side by one or more films comprising a poly-silicon layer, the opening having a first thickness; trimming the adjacent second layers through the opening to increase the thickness of the opening from the first thickness to a second thickness and decrease a first second layer thickness to a second oxide layer thickness smaller than the first second layer thickness; and depositing a word line replacement material in the opening.

Figure 22:
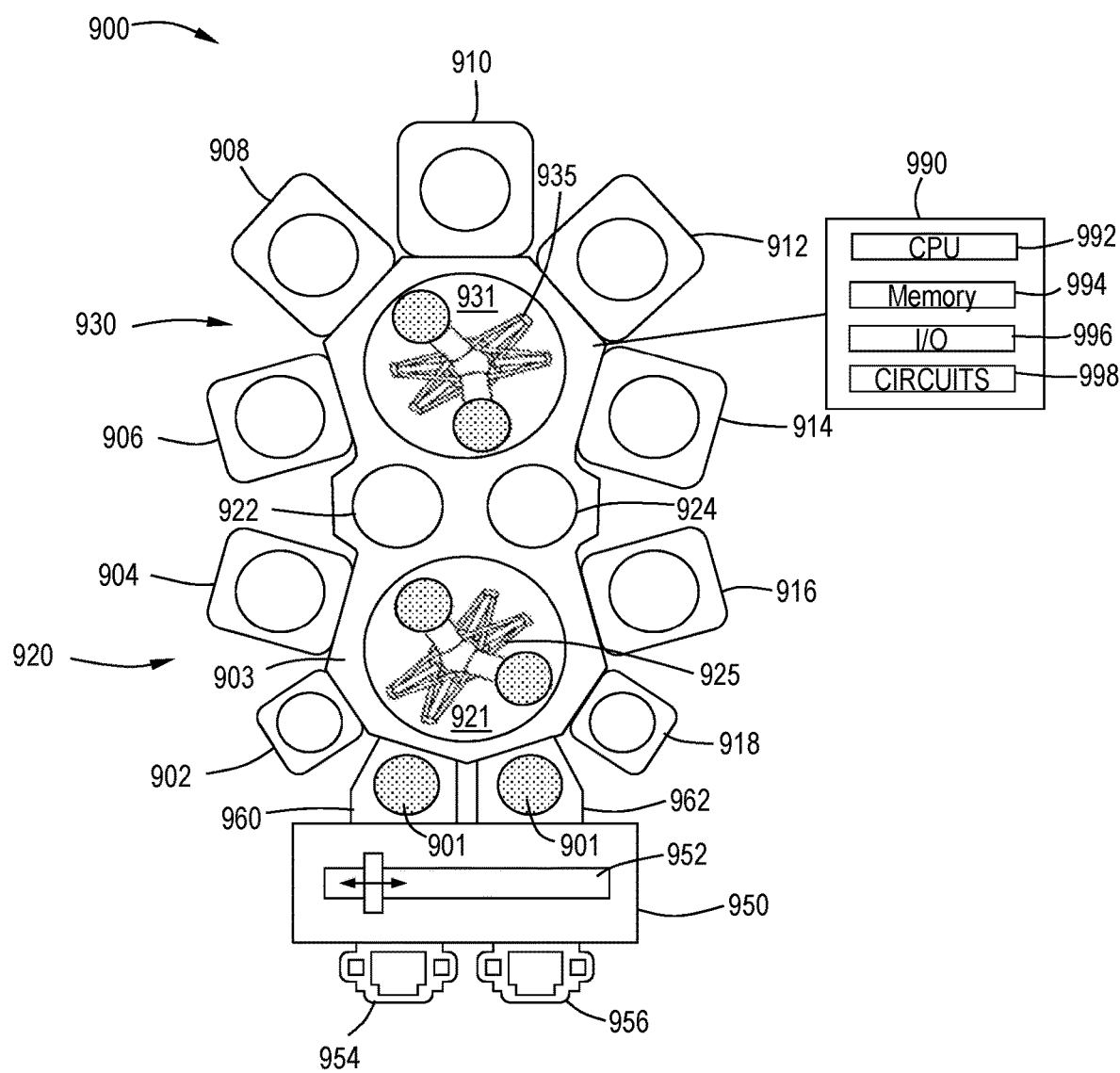
FIG. 22 illustrates a cluster tool according to one or more embodiments.

Additional embodiments of the disclosure are directed to processing tools 900 for the formation of the memory devices and methods described, as shown in FIG. 22.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a selective oxidation chamber, an oxide layer thinning chamber, or a word line deposition chamber. The particular arrangement of process chambers and components can be varied depending on the cluster tool and should not be taken as limiting the scope of the disclosure.

In some embodiments, the cluster tool 900 includes an oxide layer thinning chamber. The oxide layer thinning chamber of some embodiments comprises one or more a fluorine-based dry cleaning chamber. In some embodiments, the cluster tool 900 includes a pre-cleaning chamber connected to the central transfer station.

In the embodiment shown in FIG. 22, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism.

The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or allow water cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the system controller 990 has a configuration to control the selective deposition chamber to selectively deposit a trap layer, on a wafer at a temperature in the range of from about 400° C. to about 900° C. in an atmosphere of hydrogen ($H_2$) gas and oxygen ($O_2$) gas at ambient pressure.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a trap layer selective deposition chamber; and a controller connected to the central transfer station and the plurality of process stations, the controller configured to activate the robot to move the wafer between process stations, and to control a process occurring in each of the process stations.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A nonvolatile memory device comprising:
    a memory stack on a common source line on a substrate, the memory stack comprising a plurality of alternating first material layers and word lines and having a plurality of memory transistors extending therethrough into the substrate,
    each memory transistor comprising a channel layer and a trap layer, the trap layer confined between each word line and the channel layer, each first material layer free of the trap layer, and
    each memory transistor having a first portion and a second portion, the second portion comprising the common source line, wherein the trap layer lines a bottom surface of the second portion of the memory transistor.

2. The device of claim 1, wherein the trap layer comprises silicon nitride.

3. The device of claim 1, wherein each of the first material layers comprise oxide layers.

4. The device of claim 1, wherein each of the word lines comprise one or more of an oxide, a barrier material, and a word line metal.

5. The device of claim 1, wherein the common source line comprises one or more of poly-silicon and an oxide.

6. The device of claim 1, further comprising a bit line pad on a top surface of the memory transistor.

7. The device of claim 1, further comprising word line contacts in electrical communication with each of the word lines.

* * * * *